US012154600B2

(12) United States Patent
Sagotsky et al.

(10) Patent No.: US 12,154,600 B2
(45) Date of Patent: Nov. 26, 2024

(54) ENCLOSURE FOR COUPLING STORAGE DEVICE TO A COMPUTER

(71) Applicant: Sphere Entertainment Group, LLC, New York, NY (US)

(72) Inventors: Eric Sagotsky, Los Angeles, CA (US); John Michael Matreci, Los Angeles, CA (US); Michael Horace Graae, New York, NY (US)

(73) Assignee: Sphere Entertainment Group, LLC, New York, NY (US)

( * ) Notice: Subject to any disclaimer, the term of this patent is extended or adjusted under 35 U.S.C. 154(b) by 0 days.

(21) Appl. No.: 18/114,865

(22) Filed: Feb. 27, 2023

(65) Prior Publication Data

US 2023/0206958 A1    Jun. 29, 2023

Related U.S. Application Data

(62) Division of application No. 17/103,457, filed on Nov. 24, 2020, now Pat. No. 11,600,306.

(51) Int. Cl.
*G11B 33/12* (2006.01)
*G11B 33/02* (2006.01)
(Continued)

(52) U.S. Cl.
CPC .......... *G11B 33/122* (2013.01); *G11B 33/022* (2013.01); *G11B 33/124* (2013.01);
(Continued)

(58) Field of Classification Search
None
See application file for complete search history.

(56) References Cited

U.S. PATENT DOCUMENTS

| 4,894,739 A | 1/1990 | Kobayashi |
| 5,411,416 A | 5/1995 | Balon et al. |

(Continued)

FOREIGN PATENT DOCUMENTS

| EP | 0602255 A1 | 6/1994 |
| GB | 2153130 A | 8/1985 |

(Continued)

OTHER PUBLICATIONS

International Search Report and Written Opinion of the International Searching Authority issued in International Application No. PCT/US2021/057050 mail date Mar. 3, 2022.

*Primary Examiner* — William J Klimowicz
(74) *Attorney, Agent, or Firm* — Sterne, Kessler, Goldstein & Fox P.L.L.C.

(57) ABSTRACT

A mechanical enclosure provides a mechanism for coupling a storage device to a computer system. The mechanical enclosure can be removably coupled to the computer system and can allow for coupling of the storage device to the computer system without using specialty cables and connectors. The mechanical enclosure can allow the storage device to be coupled to computer system without significantly degrading the speed at which the data stored within the storage device is downloaded onto the computer. The storage device can be inserted into the mechanical enclosure which couples the storage device to the mechanical enclosure. The mechanical enclosure can be inserted into the computer system which similarly couples the computer system to the mechanical enclosure to effectively couple the storage device and the computer system. Once the storage device is effectively coupled to the computer system, the data stored within the storage device can be downloaded onto the computer without the need for specialty cables and connectors.

21 Claims, 12 Drawing Sheets

(51) Int. Cl.
*G06F 1/18* (2006.01)
*H01R 25/00* (2006.01)
*H05K 5/00* (2006.01)

(52) U.S. Cl.
CPC .............. *G06F 1/181* (2013.01); *G06F 1/187* (2013.01); *H01R 25/00* (2013.01); *H05K 5/0026* (2013.01)

(56) References Cited

U.S. PATENT DOCUMENTS

| | | | |
|---|---|---|---|
| 5,519,571 A | 5/1996 | Shieh | |
| 5,793,620 A | 8/1998 | Burnworth et al. | |
| 5,846,092 A | 12/1998 | Feldman et al. | |
| 6,024,607 A | 2/2000 | Wahl | |
| RE36,968 E | 11/2000 | Shieh | |
| 6,460,772 B1 | 10/2002 | Stahl | |
| 6,558,201 B1 | 5/2003 | Begley et al. | |
| 6,648,695 B1 | 11/2003 | Wu | |
| 8,083,298 B2 | 12/2011 | Henderson et al. | |
| 8,310,836 B2 | 11/2012 | Schuette | |
| 8,749,987 B2 | 6/2014 | Weber et al. | |
| 9,699,935 B1 | 7/2017 | Marrs et al. | |
| 2004/0029407 A1* | 2/2004 | Liu | H01R 27/00 439/64 |
| 2007/0162698 A1* | 7/2007 | Hsien | H05K 1/117 711/115 |
| 2009/0261211 A1* | 10/2009 | Anguiano-Wehde | H05K 7/1448 248/56 |
| 2010/0033926 A1 | 2/2010 | Du et al. | |
| 2010/0322617 A1 | 12/2010 | Liang | |
| 2012/0026674 A1 | 2/2012 | Alridge | |
| 2012/0236490 A1 | 9/2012 | Xia | |
| 2013/0232298 A1 | 9/2013 | Schuette | |
| 2014/0306011 A1* | 10/2014 | Chen | G06K 7/0073 235/441 |
| 2015/0129526 A1* | 5/2015 | Chen | A47B 88/43 384/20 |
| 2017/0354052 A1* | 12/2017 | Feyrin | G06F 1/187 |
| 2017/0359918 A1* | 12/2017 | Klaba | H05K 5/0247 |
| 2018/0081844 A1 | 3/2018 | Potter et al. | |
| 2019/0174642 A1 | 6/2019 | Choyikkunnil et al. | |

FOREIGN PATENT DOCUMENTS

| | | |
|---|---|---|
| GB | 2279816 A | 1/1995 |
| GB | 2299770 A | 10/1996 |
| JP | H04-18148 Y2 | 4/1992 |
| JP | 2000-208974 A | 7/2000 |

\* cited by examiner

ENCLOSURE FOR COUPLING STORAGE DEVICE TO A COMPUTER

CROSS REFERENCE TO RELATED APPLICATIONS

This application is a divisional of U.S. patent application Ser. No. 17/103,457, filed on Nov. 24, 2020, which is incorporated herein in its entirety by reference thereto.

BACKGROUND

The United States Media and Entertainment Industry is the largest in the world. The United States Media and Entertainment Industry represents a third of the global media and entertainment industry which delivers events, such as musical events, theatrical events, sporting events, and/or motion picture events, to spectators for their viewing pleasure. Presently, venues, such as music venues and/or sporting venues to provide an example, use high-resolution cameras to record these events. These high-resolution cameras often record significant amounts of data onto removable storage devices to record these events.

BRIEF DESCRIPTION OF THE FIGURES

Aspects of the present disclosure are best understood from the following detailed description when read with the accompanying figures. It is noted that, in accordance with the standard practice in the industry, features are not drawn to scale. In fact, the dimensions of the features may be arbitrarily increased or reduced for clarity of discussion.

DETAILED DESCRIPTION

Figure 1A:
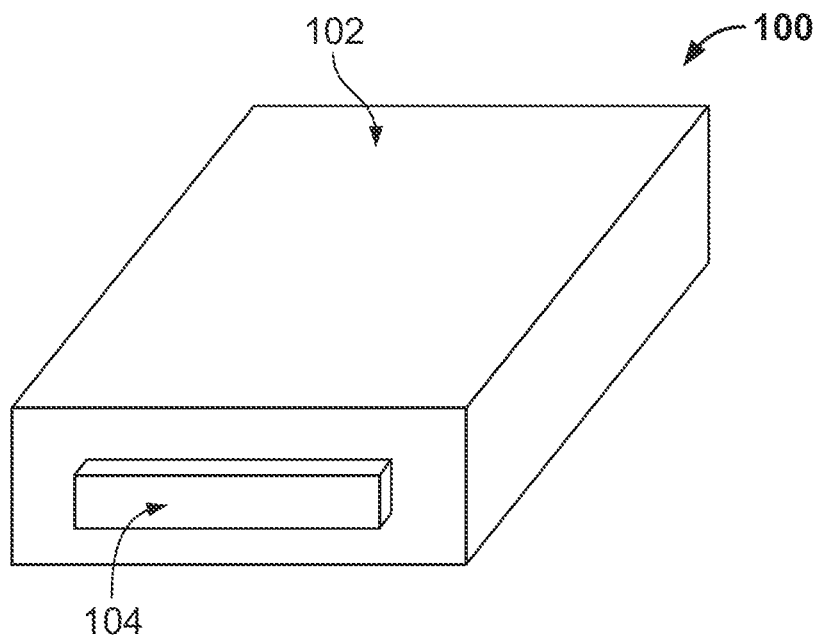
FIG. 1A shows a media in accordance with some exemplary embodiments.

Video cameras are widely used in the entertainment industry, including film and television production and coverage of events, such as sporting events, theatrical events, sporting events, and/or motion picture events. The video cameras can be used to capture various scenes, such as a cityscape or a nature scene to some provide some examples. These video cameras may record these events and/or scenes in various resolutions, for example, 4K resolution 8K resolution, 12K×6K resolution, or 9K×7K resolution. These video cameras often record significant amounts of data onto removable storage devices to record these events and/or scenes. For example, these removable storage devices can store 240 gigabytes (GBs), 480 GBs, 960 GBs, 1 terabyte (TB), 2 TBs, 3 TBs, or 4 TBs of data. And these removable storage devices are designed using proprietary technology which requires specialty, often proprietary, cables and connectors to connect these removable storage devices to a computer to download the data stored within these removable storage devices onto the computer. Often times, it is an extremely time-consuming process to download the data stored within these removable storage devices onto the computer. As such, multiple removable storage devices are often simultaneously connected to the computer to simultaneously download the data stored within these multiple removable storage devices onto the computer.

Because each of these multiple removable storage devices requires its own specialty cables and connectors, set up and break down can be complex and time consuming. And these specialty cables and connectors often become intertwined with one another creating what is commonly referred to as a rat's nest. Offloading data stored within these multiple removable storage devices can create a cumbersome rat's nest of cabling, and it can take hours or even days to offload all of the data from the removable storage devices. Not only do these specialty cables and connectors create this rat's nest, these specialty cables and connectors can effectively degrade the speed at which the data stored within these removable storage devices is downloaded onto the computer. For example, unwanted parasitic inductances and/or capacitance within these specialty cables and connectors can effectively reduce the speed at which the data stored within these removable storage devices is downloaded onto the computer.

Overview

An exemplary mechanical enclosure provides a mechanism for coupling a storage device, for example, the removable storage device as discussed above, to a computer system. In some embodiments, the exemplary mechanical enclosure can be removably coupled to the computer system and can allow for coupling of the storage device to the computer system without using specialty cables and connectors. In some embodiments, the exemplary mechanical enclosure can allow the storage device to be coupled to computer system without significantly degrading the speed at which the data stored within the storage device is downloaded onto the computer. As to be described in further detail below, the storage device can be inserted into the exemplary mechanical enclosure which couples the storage device to the exemplary mechanical enclosure. In some embodiments, the exemplary mechanical enclosure can be inserted into the computer system which similarly couples the computer system to the exemplary mechanical enclosure to effectively couple the storage device and the computer system. Once the storage device is effectively coupled to the computer system, the data stored within the storage device can be downloaded onto the computer without the need for specialty cables and connectors.

Exemplary Storage Device

FIG. 1A graphically illustrates an exemplary storage device in accordance with some exemplary embodiments. As described above, a video camera can capture an event, such as a sporting event, a theatrical event, and/or a motion picture event to provide some examples, as the event is occurring in real-time. In some embodiments, the video camera can alternatively, or additionally, capture a scene, such as a cityscape or a nature scene to provide some examples. The video camera can thereafter store audible and/or visual data representing the event and/or the scene in a digital form as digital data onto a storage device 100. In the exemplary embodiment illustrated in FIG. 1A, the storage device 100 can represent a removable storage device which can be removably coupled to, for example, ejected and/or unmounted from, a digital data recording device, such as the video camera described above. One such storage device 100 can be a solid-state drive (SSD) system distributed by RED, also referred to as a RED MINI-MAG or simply a RED-MAG. As illustrated in FIG. 1A, the storage device 100 includes a storage device enclosure 102 and a storage device connector 104. Although the discussion to follow is to be described in terms of the storage device 100, those skilled in the relevant art(s) will recognize that the teachings herein are equally applicable to any other suitable storage device that stores digital data that will be recognized by those skilled in the relevant art(s) without departing from the spirit and scope of the present disclosure.

In the exemplary embodiment illustrated in FIG. 1A, the storage device enclosure 102 represents a mechanical housing enclosing various electrical, mechanical, and/or electro-mechanical devices of the storage device 100 for storing the digital data. In some embodiments, the digital data stored within the storage device 100 can represent audible and/or visual data representing the event and/or the scene that was captured by the video camera as described above. In some embodiments, the electrical, mechanical, and/or electro-mechanical devices can include one or more solid-state memory storage devices which can store the digital data using, for example, one or more volatile memory storage devices, such as one or more random-access memory (RAM) storage devices to provide an example, and/or one or more non-volatile memory storage devices, such as one or more read-only memory (ROM) storage devices to provide some examples. The one or more RAM storage devices can be implemented as one or more dynamic random-access memories (DRAMs), one or more static random-access memories (SRAMs), and/or one or more non-volatile random-access memories (NVRAMs), often referred to as a flash memories, to provide some examples. The ROM storage device can be implemented as one or more programmable read-only memory (PROMs), one or more one-time programmable ROMs (OTPs), one or more erasable programmable read-only memories (EPROMs) and/or one or more electrically erasable programmable read-only memories (EEPROMs) to provide some examples. In some embodiments, the electrical, mechanical, and/or electro-mechanical devices can alternatively, or additionally, include one or more phase-change memory (PCM) storage devices. The PCM storage device can be implemented as one or more phase change memories (PCM) and/or one or more phase change random access memories (PCRAM) to provide some examples.

In the exemplary embodiment illustrated in FIG. 1A, the storage device connector 104 represents an electromechanical device which can be utilized to access the electrical, mechanical, and/or electro-mechanical devices within the storage device enclosure 102 to write the digital data to the storage device 100 and/or to read the digital data from the storage device 100. For example, the video camera, as described above, utilizes the storage device connector 104 to access the various electrical, mechanical, and/or electro-mechanical devices within the storage device enclosure 102 to write the digital data onto the storage device 100. As another example, a computer system, which is to be described in further detail below, can utilize the storage device connector 104 to access the various electrical, mechanical, and/or electro-mechanical devices within the storage device enclosure 102 to read the digital data from the storage device 100. In some embodiments, the storage device connector 104 can be implemented as one or more External Serial Advanced Technology Attachment (eSATA) connectors, one or more Serial Advanced Technology Attachment Express (SATA Express) connectors, one or more U.2 connectors, one or more FireWire connectors, one or more connectors Universal Serial Bus (USB), and/or one or more suitable connectors of any suitable technology, or technologies, that will be apparent to those skilled in the relevant art(s) without departing from the spirit and scope of the present disclosure.

Exemplary Mechanical Storage Device Enclosure

Figure 1B:
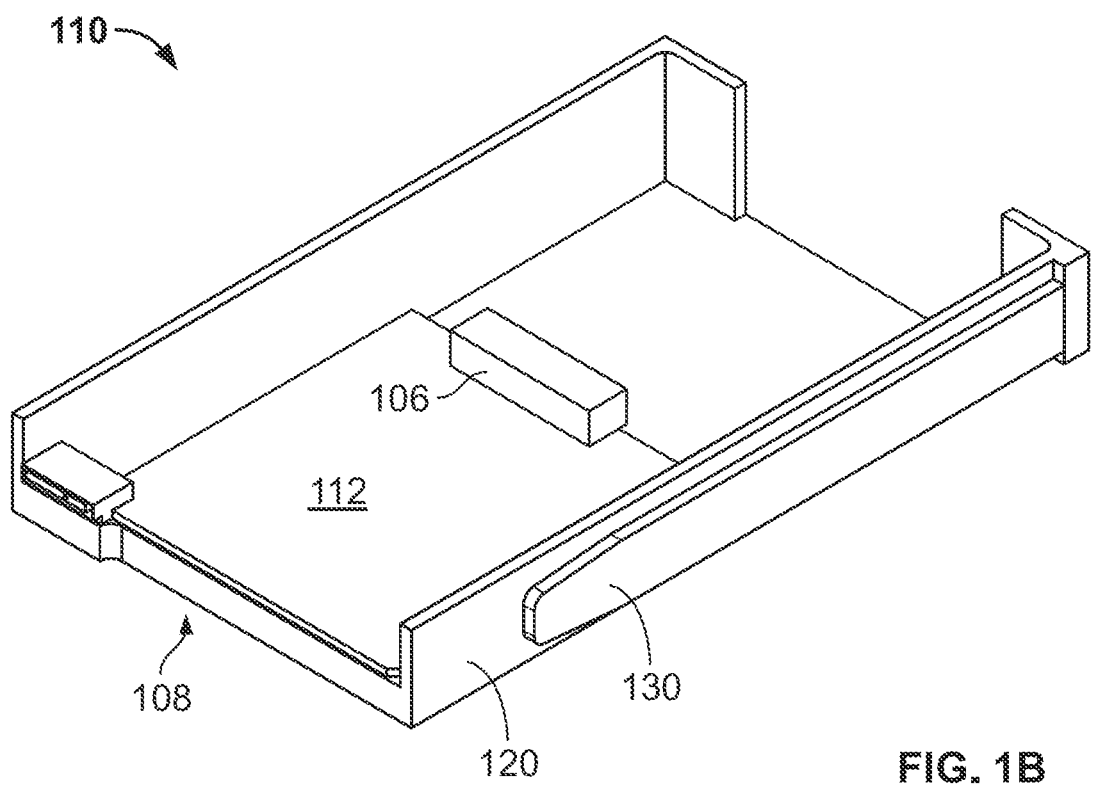
FIG. 1B shows an exemplary enclosure in accordance with some exemplary embodiments.
Figure 1C:
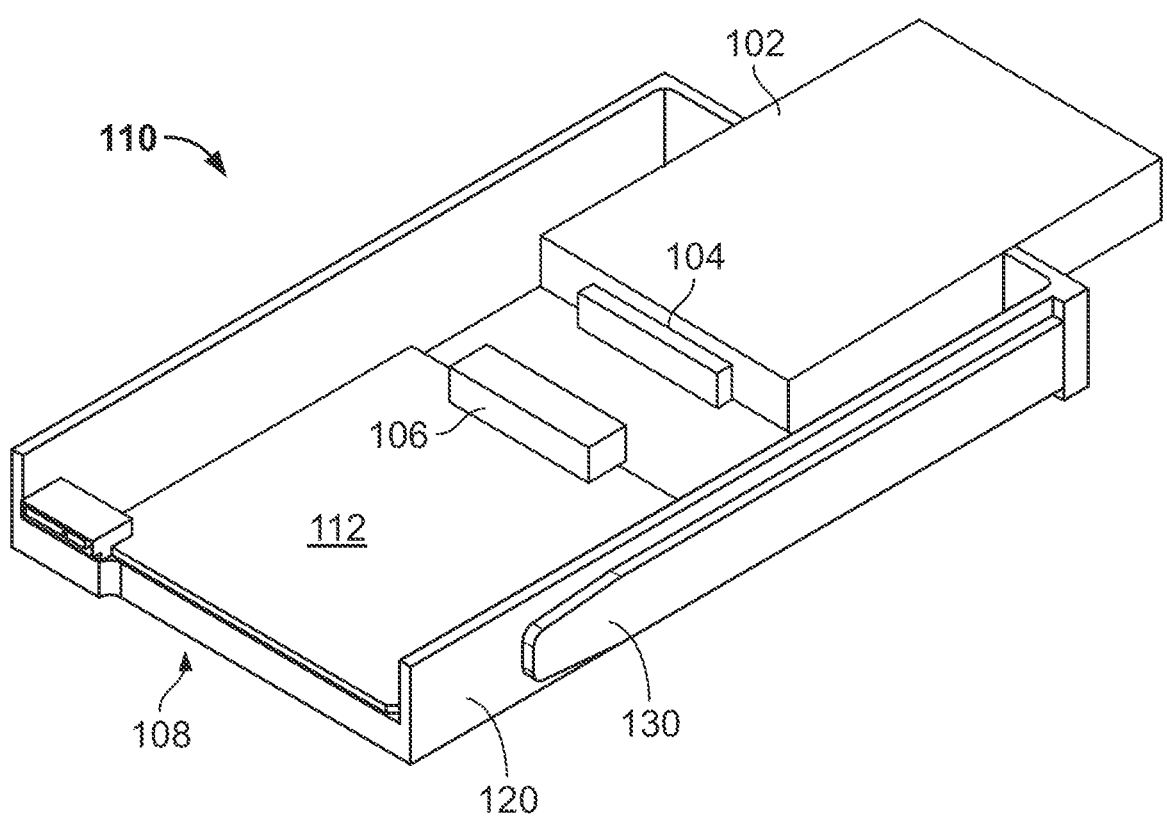
FIG. 1C shows the exemplary media of FIG. 1A partially inserted in the exemplary enclosure of FIG. 1B.
Figure 1D:
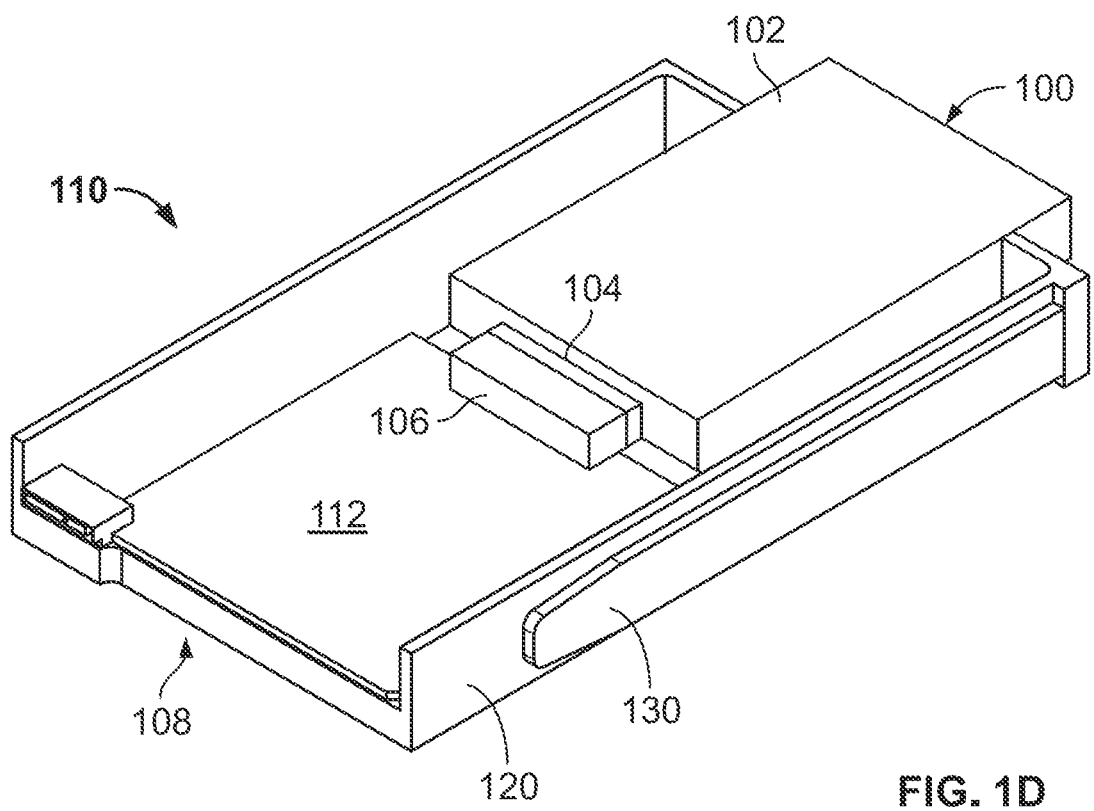
FIG. 1D shows the exemplary media of FIG. 1A coupled to the exemplary enclosure of FIG. 1B.

FIG. 1B through FIG. 1D illustrate simplified diagrams of an exemplary mechanical storage device enclosure in accordance with some exemplary embodiments. In the exemplary embodiment illustrated in FIG. 1B through FIG. 1D, a mechanical storage device enclosure 110 provides a mechanism for coupling a storage device, such as the storage device 100 to provide an example, to a computer system. As to be described in further detail below, the storage device 100 can be inserted into the mechanical storage device enclosure 110. The mechanical storage device enclosure 110 can thereafter be inserted into the computer system to effectively couple the storage device 100 and the computer system. Once the storage device 100 is effectively coupled to the computer system, data stored within the storage device can be downloaded onto the computer system without the need for specialty cables and connectors as described above. In some embodiments, this allows the digital data to be transferred from the storage device 100 to the computer system at a speed of at least 200 megabytes per second (MB/s), for example, at least 225 MB/s, at least 250 MB/s, at least 275 MB/s, at least 300 MB/s, at least 500 MB/s, at least 1 GB/s, at least 2 GB/s, at least 3 GB/s, at least 4 GB/s, at least 5 GB/s, or at least 6 GB/s, without being degraded by these specialty cables and connectors. As illustrated in FIG. 1B through FIG. 1D, the mechanical storage device enclosure 110 includes an electrical interface card 112 and a mechanical housing 120.

In the exemplary embodiments illustrated in FIG. 1B through FIG. 1D, the mechanical housing 120 represents a mechanical enclosure having the electrical interface card 112. In some embodiments, the mechanical housing 120 can be implemented using one or more metallic materials, such as iron, steel, copper, bronze, brass, or aluminum to provide some examples, one or more non-metallic materials, such as wood, plastic, or glass, and/or any combination thereof. In some embodiments, the mechanical housing 120 has a length of about 4.5 inches to about 5 inches (e.g., about 4.75 inches), a width of about 2.5 inches to about 4 inches (e.g., about 2.5 inches to about 3.5 inches or about 3.5 inches to about 4 inches), for example, about 2.75 inches, and a height of about 0.5 inches to about 1.75 inches (e.g., about 0.5 inches to about 0.75 inches or 1.25 inches to about 1.75 inches). In some embodiments, the mechanical housing 120 has a width of about 2.75 inches and a height of about 0.6 inches. In some embodiments, the mechanical housing 120 has a width of about 3.85 inches and a height of about 1.5 inches. In some embodiments, the electrical interface card 112 can be mechanically connected or attached to the mechanical housing 120 using one or more fasteners, such as nuts, screws, bolts, and/or lags to provide some examples. In these embodiments, this mechanical connection or attachment between the mechanical housing 120 and electrical interface card 112 can significantly lessen movement of the electrical interface card 112. As illustrated in FIG. 1B, the mechanical housing 120 can include an opening with a size corresponding to a cross sectional area of the storage device 100. In these embodiments, the storage device 100 can be inserted through the opening of the mechanical housing 120 to couple the storage device 100 to the electrical interface card 112 as illustrated in FIG. 1C and FIG. 1D.

In the exemplary embodiment illustrated in FIG. 1B through FIG. 1D, the electrical interface card 112 operates an interface between the storage device 100 and the computer system. In some embodiments, the electrical interface card 112 provides an interconnected network of electrical interconnections between a storage device connector 106 and a computer system connector 108 which can be utilized to couple the storage device 100 and the computer system. In some embodiments, the storage device connector 106 and the computer system connector 108 can be implemented as one or more rectangular connectors, one or more terminal blocks, one or more D-Sub, or D-Shaped, connectors, one or more External Serial Advanced Technology Attachment (eSATA) connectors, one or more Serial Advanced Technology Attachment Express (SATA Express) connectors, one or more U.2 connectors, one or more FireWire connectors, one or more connectors Universal Serial Bus (USB), one or more industry standard architecture (ISA) connectors, one or more extended ISA (EISA) connectors, one or more peripheral component interconnect (PCI) connectors, one or more peripheral component interconnect extended (PCIx) connectors, one or more PCI express (PCIe) connectors, and/or one or more suitable connectors of any suitable technology, or technologies, that will be apparent to those skilled in the relevant art(s) without departing from the spirit and scope of the present disclosure.

In some embodiments, the electrical interface card 112 can be implemented as a printed circuit board (PCB) having the storage device connector 106 and the computer system connector 108. In these embodiments, the storage device connector 106 and the computer system connector 108 can be implemented using one or more chassis or panel connectors, one or more printed circuit board (PCB) mount connectors, and/or any other suitable connector type that will be apparent to those skilled in the relevant art(s) without departing from the spirit and scope of the present disclosure. In an exemplary embodiment, the storage device 100 can be the solid-state drive (SSD) system distributed by RED, also referred to as a RED MINI-MAG or simply a REDMAG, as described above. In this exemplary embodiment, the storage device connector 106 can be configured and arranged to be complaint with External Serial Advanced Technology Attachment (eSATA), SATA Express, U.2 connectors, FireWire, Universal Serial Bus (USB) or any number of other technologies to provide some examples. In another exemplary embodiment, the computer system can include any suitable technology, or technologies, such as industry standard architecture (ISA), extended ISA (EISA), peripheral component interconnect (PCI), peripheral component interconnect extended (PCIx), PCI express (PCIe), or any number of other technologies to provide some examples. In this other exemplary embodiment, the computer system connector 108 can be configured and arranged to be complaint with one or more of these technologies.

In some embodiments, the electrical interface card 112 can additionally include electronic circuitry to convert one or more parameters, characteristics, and/or attributes of signals traversing between the storage device connector 106 and the computer system connector 108. For example, this electronic circuitry can include one or more optical-electrical converters to convert optical signals received from the storage device 100 via one or more connectors 106 into electrical signals for transmission to the computer system and/or optical signals received from the computer system via one or more connectors 108 into electrical signals for transmission to the storage device 100. Alternatively, or in addition to, the one or more optical-electrical converters can convert electrical signals received from the storage device 100 via one or more connectors 106 into optical signals for transmission to the computer system and/or electrical signals received from the computer system via one or more connectors 108 into optical signals for transmission to the storage device 100. As another example, this electronic circuitry can convert between any suitable technology, or technologies, such as External Serial Advanced Technology Attachment (eSATA), SATA Express, U.2 connectors, FireWire, Universal Serial Bus (USB), industry standard architecture (ISA), extended ISA (EISA), peripheral component interconnect (PCI), peripheral component interconnect extended (PCIx), PCI express (PCIe), or any number of other technologies that will be apparent to those skilled in the relevant art(s) without departing from the spirit and scope of the present disclosure. For example, this electronic circuitry can convert between logical levels of a first technology, such as 2.8-3.6 volts (V) for logical high level for Low-speed (LS) and Full-speed (FS) modes of USB 3.0 or 360 to 440 millivolt (mV) for logical high level for High-speed (HS) mode of USB 3.0, into logical levels of a second technology, such as 700 mV logical high level for PCIe. As another example, this electronic circuitry can convert single ended signals received from the one or more connectors 106 and/or the one or more connectors 108 into differential signals and/or into differential signals received from the one or more connectors 106 and/or the one or more connectors 108 into single ended signals.

As illustrated in FIG. 1C, the storage device 100 can be inserted into the mechanical housing 120 to couple the storage device 100 and the electrical interface card 112. In the exemplary embodiment illustrated in FIG. 1C and FIG. 1D, the storage device 100 can be inserted into the mechanical housing 120 to couple the storage device connector 104 and the storage device connector 106. In some embodiments, the storage device connector 104 and the storage device connector 106 form a male-female, or plug-receptacle, pair of connectors. In these embodiments, the storage device connector 104 can be connected, or mated, to the storage device connector 106 to couple the storage device 100 and the electrical interface card 112 as illustrated in FIG. 1D. As to be described in further detail below, the mechanical storage device enclosure 110 can be inserted into the computer system to effectively couple the storage device 100 and the computer system. As to be described in further detail below, the computer system connector 108 can be coupled to a corresponding computer system connector within the computer system to couple the electrical interface card 112 and the computer system. the storage device connector 104 can be coupled to the storage device connector 106 to couple the storage device 100 and the electrical interface card 112. And, the computer system connector 108 can be coupled to a corresponding computer system connector within the computer system to couple the electrical interface card 112 and the computer system. In some embodiments, the computer system connector 108 and the corresponding computer system connector within the computer system can be connected, or mated, to couple the electrical interface card 112 and the computer system. Once the storage device 100 is effectively coupled to the computer system, data stored within the storage device can be downloaded onto the computer system without the need for specialty cables and connectors as described above. In the exemplary embodiment illustrated in FIG. 1B through FIG. 1D, the mechanical storage device enclosure 110 can include one or more guide rails 130. The one or more guide rails 130 can direct the computer system connector 108 toward the corresponding computer system connector within the computer system as the mechanical storage device enclosure 110 is being inserted into the computer system. In some embodiments, the computer system can similarly include one or more corresponding tracks to accept the one or more guide rails 130. In these embodiments, the one or more corresponding tracks of the computer system can utilize the one or more guide rails 130 to direct the computer system connector 108 toward the corresponding computer system connector within the computer system as the mechanical storage device enclosure 110 is being inserted into the computer system.

Exemplary Computer System

Figure 2A:
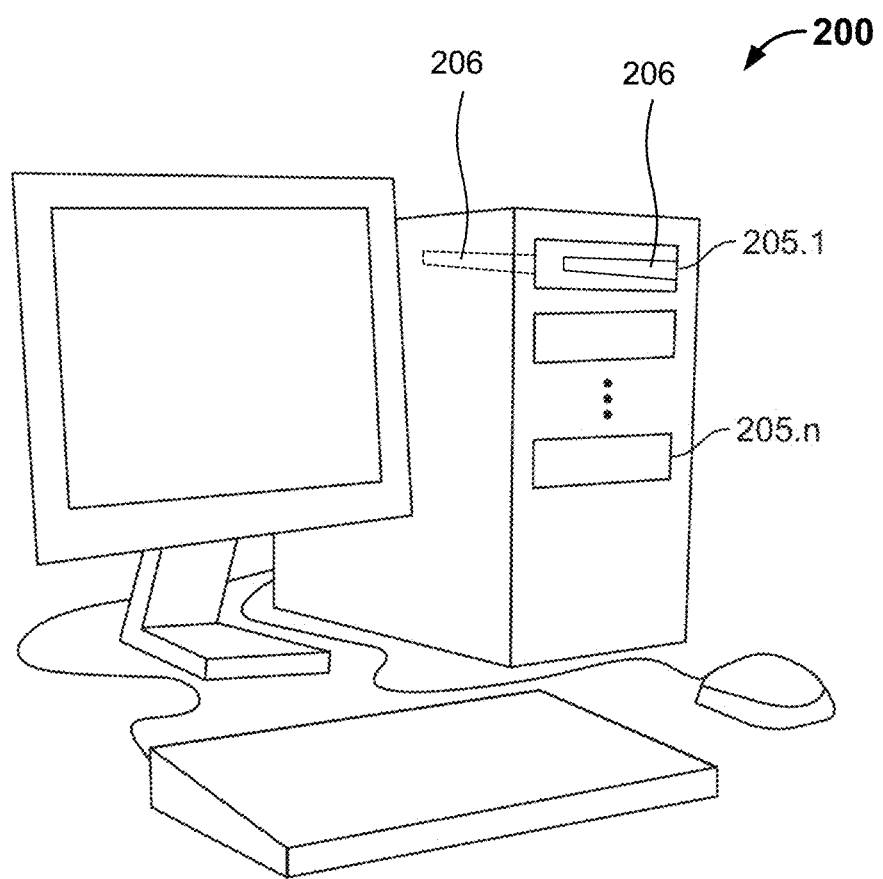
FIG. 2A shows a computer system and an enclosure in accordance with some exemplary embodiments.
Figure 2B:
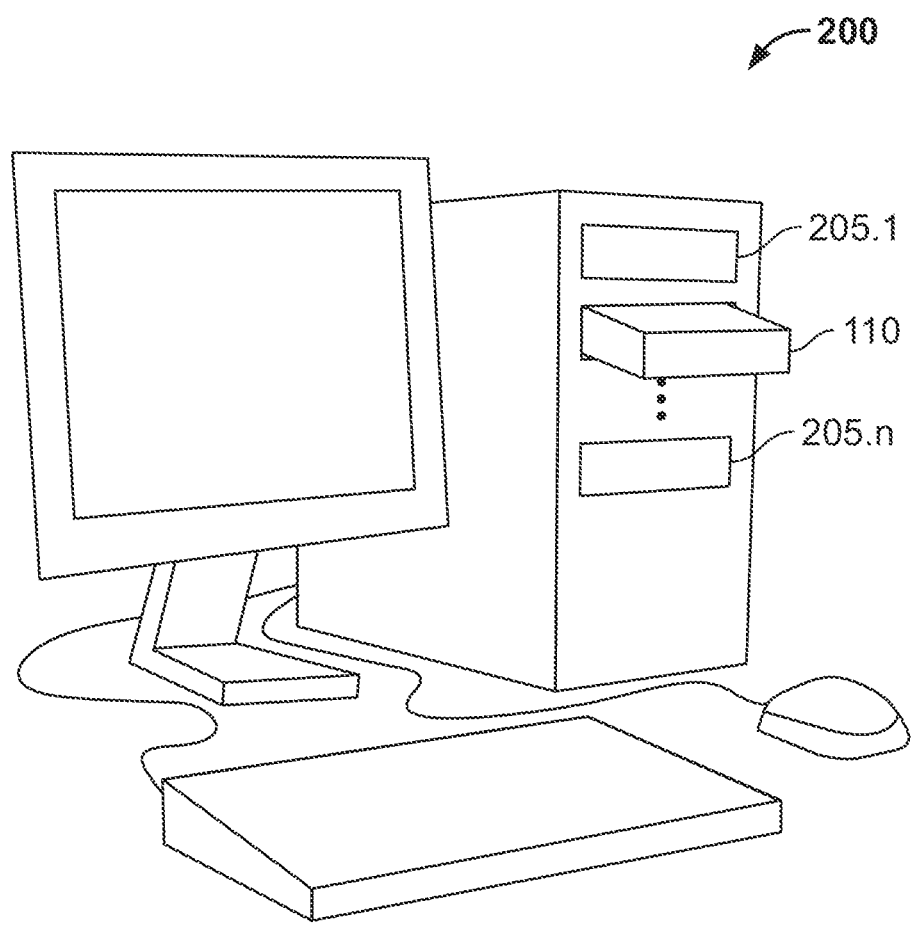
FIG. 2B shows a computer system and an enclosure in accordance with some exemplary embodiments.
Figure 2C:
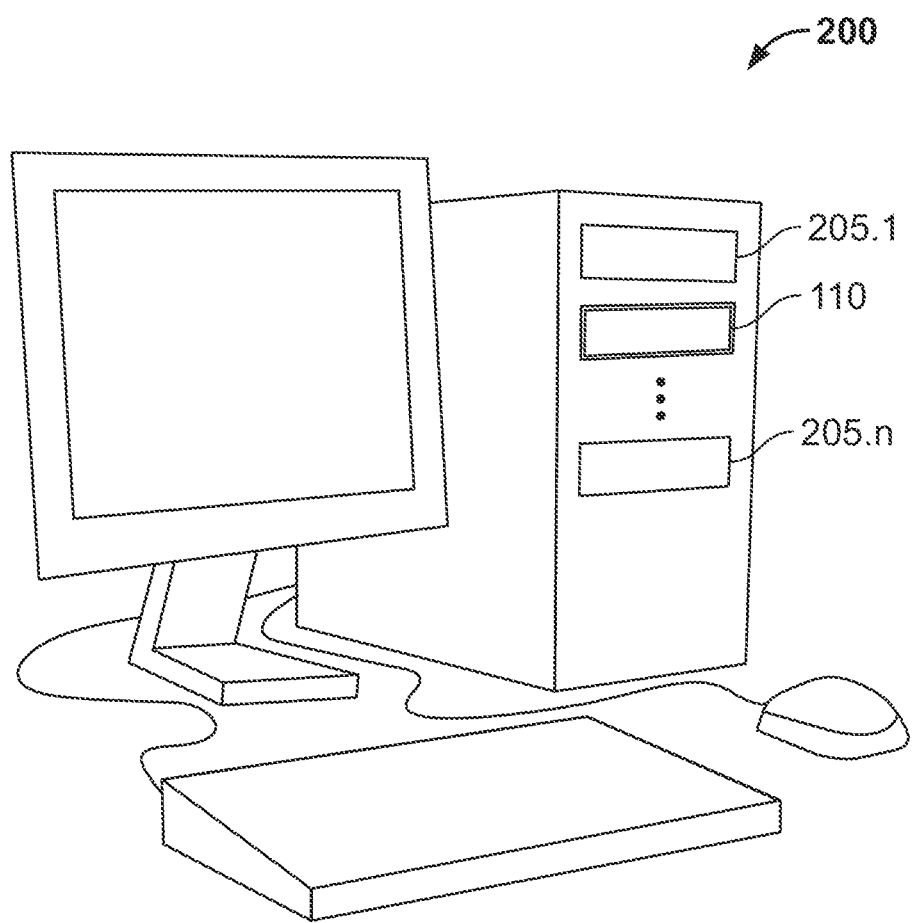
FIG. 2C shows multiple enclosures coupled to the computer system of FIG. 2B.

FIG. 2A through FIG. 2C illustrate an exemplary computer system in accordance with some exemplary embodiments. As described above, a mechanical storage device enclosure, such as the mechanical storage device enclosure 110 to provide an example, having a storage device, such as the storage device 100 to provide an example, can be coupled to a computer system 200. As to be described in further detail below, the storage device 100 can be inserted into the computer system 200 to effectively couple the storage device 100 and the computer system. Once the storage device 100 is effectively coupled to the computer system 200, data stored within the storage device can be downloaded onto the computer system 200 without the need for specialty cables and connectors as described above. In some embodiments, this allows the digital data to be transferred from the storage device 100 to the computer system at a speed of at least 200 megabytes per second (MB/s), for example, at least 225 MB/s, at least 250 MB/s, at least 275 MB/s, or at least 300 MB/s, at least 500 MB/s, at least 1 GB/s, at least 2 GB/s, at least 3 GB/s, at least 4 GB/s, at least 5 GB/s, or at least 6 GB/s, at least 10 GB/s, at least 15 GB/s, at least 25 GB/s, at least 35 GB/s, at least 45 GB/s, or at least 60 GB/s, without being degraded by these specialty cables and connectors. In some embodiments, the digital data may be transferred from the storage device 100 to the computer system at a speed of about 16 GB/s. Alternatively, or in addition to, the digital data may be transferred from the storage device 100 to the computer system at a speed of about 64 GB/s.

As illustrated in FIG. 2A through FIG. 2C, the computer system 200 includes drive bays 205.1 through 205.n. Although the computer system 200 is illustrated as being a personal computer in FIG. 2A through FIG. 2C, this is for illustrative purposes only. Those skilled in the relevant art(s) will recognize that the teachings herein are equally applicable to other types of electronic devices, such as one or consumer electronics devices, cellular phones, smartphones, feature phones, tablet computers, wearable computer devices, personal digital assistants (PDAs), pagers, wireless handsets, laptop computers, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), networked or "smart" appliances, Machine-Type-Communication (MTC) devices, Machine-to-Machine (M2M) devices, and/or Internet of Things (IoT) devices to provide some examples. In some embodiments, the drive bays 205.1 through 205.n can be implemented using one or more standardized sizes, such as 5.25 inches, 3.5 inches, 2.5 inches, 1.8 inches, and/or any combination thereof to provide some examples.

As illustrated in FIG. 2B, the mechanical storage device enclosure 110 can be inserted into one of the drive bays 205.1 through 205.n, such as a drive bay 205.x from among the drive bays 205.1 through 205.n to provide an examples, to couple the storage device 100 to the computer system 200. Although the FIG. 2A and FIG. 2C illustrate only one mechanical storage device enclosure 110 being inserted into the drive bay 205.x, those skilled in the relevant art(s) will recognize that multiple mechanical storage device enclosures 110 can be inserted into the drive bays 205.1 through 205.n to simultaneously transfer digital data stored within the storage devices 100 within these multiple mechanical storage device enclosures 110. In some embodiments, the storage device 100 can be inserted into the mechanical storage device enclosure 110, as described above in FIG. 1B through FIG. 1D, which is thereafter inserted into the drive bay 205.x as to be described in further detail below. Alternatively, or in addition to, the mechanical storage device enclosure 110 can be inserted into the drive bay 205.x, as to be described in further detail below, with the storage device 100 thereafter being inserted into the mechanical storage device enclosure 110 as described above in FIG. 1B through FIG. 1D. In some embodiments, the drive bays 205.1 through 205.n allow the mechanical storage device enclosure 110 to be plugged into the computer system 200. Although not illustrated in FIG. 2A through FIG. 2C, the drive bays 205.1 through 205.n include one or more computer system connectors. In some embodiments, the one or more computer system connectors can be implemented as one or more rectangular connectors, one or more terminal blocks, one or more D-Sub, or D-Shaped, connectors, one or more External Serial Advanced Technology Attachment (eSATA) connectors, one or more Serial Advanced Technology Attachment Express (SATA Express) connectors, one or more U.2 connectors, one or more FireWire connectors, one or more connectors Universal Serial Bus (USB), one or more industry standard architecture (ISA) connectors, one or more extended ISA (EISA) connectors, one or more peripheral component interconnect (PCI) connectors, one or more peripheral component interconnect extended (PCIx) connectors, one or more PCI express (PCIe) connectors, and/or one or more suitable connectors of any suitable technology, or technologies, that will be apparent to those skilled in the relevant art(s) without departing from the spirit and scope of the present disclosure.

As illustrated in FIG. 2C, the one or more computer system connectors can be coupled to the computer system connector 108 of the mechanical storage device enclosure 110 to couple the electrical interface card 112 and the computer system. In some embodiments, the computer system connector 108 and the one or more computer system connectors within the drive bays 205.1 through 205.n can be connected, or mated, to couple the computer system 200 and the storage device 100. Once the storage device 100 is effectively coupled to the computer system 200, data stored within the storage device can be downloaded onto the computer system without the need for specialty cables and connectors as described above. In some embodiments, the drive bays 205.1 through 205.$n$ can include one or more corresponding tracks 206 to accept the one or more guide rails 130 of the mechanical storage device enclosure 110. In these embodiments, the one or more corresponding tracks 206 of the computer system can utilize the one or more guide rails 130 to direct the computer system connector 108 toward the computer system connectors within the drive bays 205.1 through 205.$n$ as the mechanical storage device enclosure 110 is being inserted into the drive bays 205.1 through 205.$n$.

All of these benefits can result in a system that is versatile and can accelerate data transfer times by simultaneously coupling numerous enclosures to the computer system 200. The number of mechanical storage device enclosures 110 that may be coupled to the computer is based upon the number of drive bays from among the drive bays 205.1 through 205.$n$. For example, if the event and/or the scene, as described above, uses eight video cameras to store audible and/or visual data representing the event and/or the scene in a digital form as digital data onto eight storage devices 100, these eight storage devices 100 can be inserted into eight mechanical storage device enclosures 110. Once the storage devices 100 are inserted, these eight mechanical storage device enclosures 110 can be inserted into eight drive bays 205.1 through 205.8 of the computer system 200 to simultaneously transfer the digital data stored within these eight storage devices 100 to the computer system 200.

Exemplary Mechanical Storage Device Enclosure with Adjustable Side Rails

Figure 3:
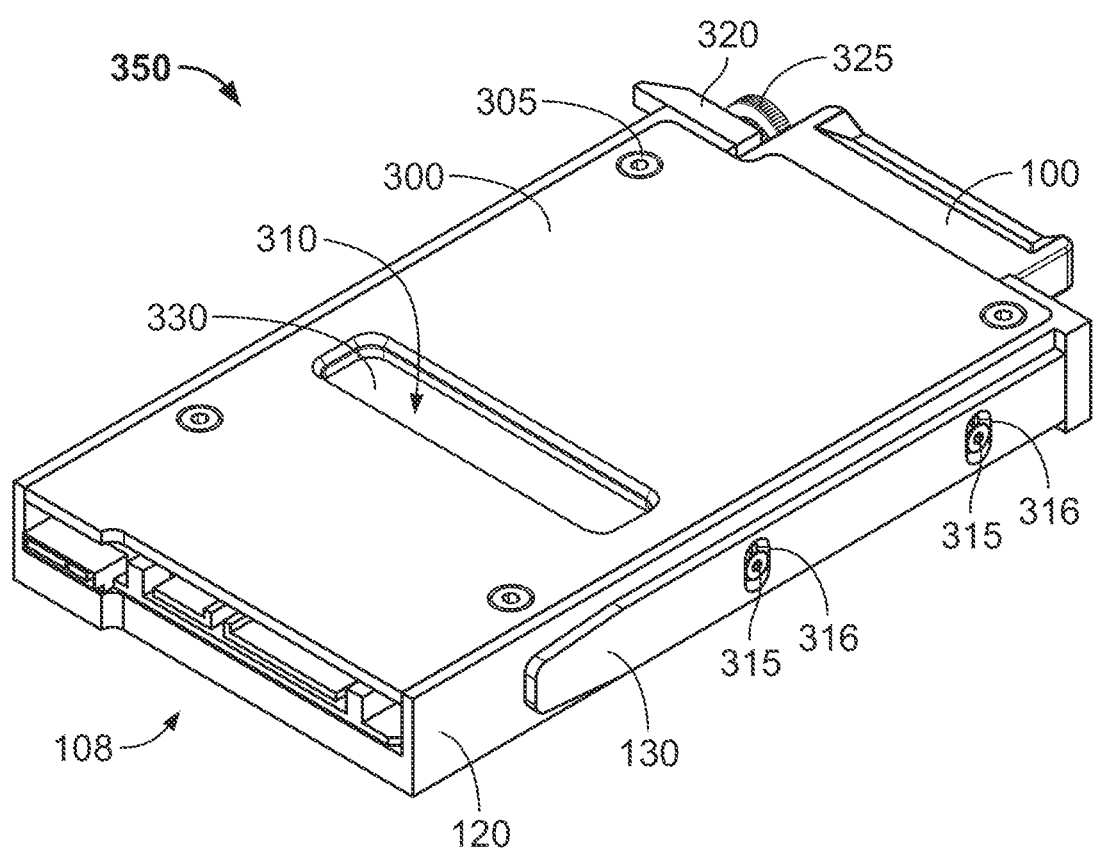
FIG. 3 shows a mechanical storage device enclosure in accordance with some exemplary embodiments.

FIG. 3 through FIG. 8 illustrate more detailed diagrams of the exemplary mechanical storage device enclosure in accordance with some exemplary embodiments. FIG. 3 further illustrates the exemplary mechanical storage device enclosure having the exemplary storage device. A mechanical storage device enclosure 350, as illustrated in FIG. 3, shares many substantially similar features as the mechanical storage device enclosure 110 as described above in FIG. 1B through FIG. 2C; therefore, only differences between these mechanical storage device enclosures are to be described in further detail below. As illustrated in FIG. 3, the mechanical storage device enclosure 350 may additionally include a top enclosure 300. As illustrated in FIG. 3, the mechanical storage device enclosure 350 additionally includes a top enclosure 300, one or more fasteners 305, and/or one or more fasteners 315.

In the exemplary embodiment illustrated in FIG. 3, the top enclosure 300 represents a cover or lid for the mechanical housing 120 to secure the storage device 100 within the mechanical housing 120. As illustrated in FIG. 3, the top enclosure 300 can be removably coupled to the mechanical housing 120 by the one or more fasteners 305, such as nuts, screws, bolts, and/or lags to provide some examples. In some embodiments, the top enclosure 300 can be implemented using one or more metallic materials, such as iron, steel, copper, bronze, brass, or aluminum to provide some examples, one or more non-metallic materials, such as wood, plastic, or glass, and/or any combination thereof. In some embodiments, the top enclosure 300 can include an opening 310. In some embodiments, the storage device 100 can include a protrusion, or bulge, on its surface which enters into the opening 310 as the storage device 100 is being inserted into the mechanical housing 120 as described above in FIG. 1B through FIG. 1D to effectively secure the storage device 100 within the mechanical housing 120.

As illustrated in FIG. 3, the one or more guide rails 130 can be removably coupled to the mechanical housing 120, for example, by the one or more fasteners 315, such as nuts, screws, bolts, and/or lags to provide some examples. Additionally, different computers may have different types of devices for coupling drives, for example, mechanical storage device enclosure 110, within the drive bays 205.1 through 205.$n$. To accommodate different coupling devices, the one or more guide rails 130 can be interchangeable. For example, the one or more guide rails 130 can be replaced by different guide rails that are shaped and sized to fit in within the drive bays 205.1 through 205.$n$ of different computer systems. Additionally, the one or more guide rails 130 can be coupled to the mechanical housing 120 by the one or more fasteners 315, for example, nuts, screws, bolts, and/or lags, attached to mechanical housing 120 through opening 316. Each opening 316 can be an elongated hole, as illustrated in FIG. 3 to allow for adjustment of the one or more guide rails 130 on the side of mechanical housing 120. This adjustment allows for the guide rails to be precisely positioned within the drive bays 205.1 through 205.$n$ of computer system 200. In some embodiments, the one or more guide rails 130 are both interchangeable and adjustable.

Figure 4:
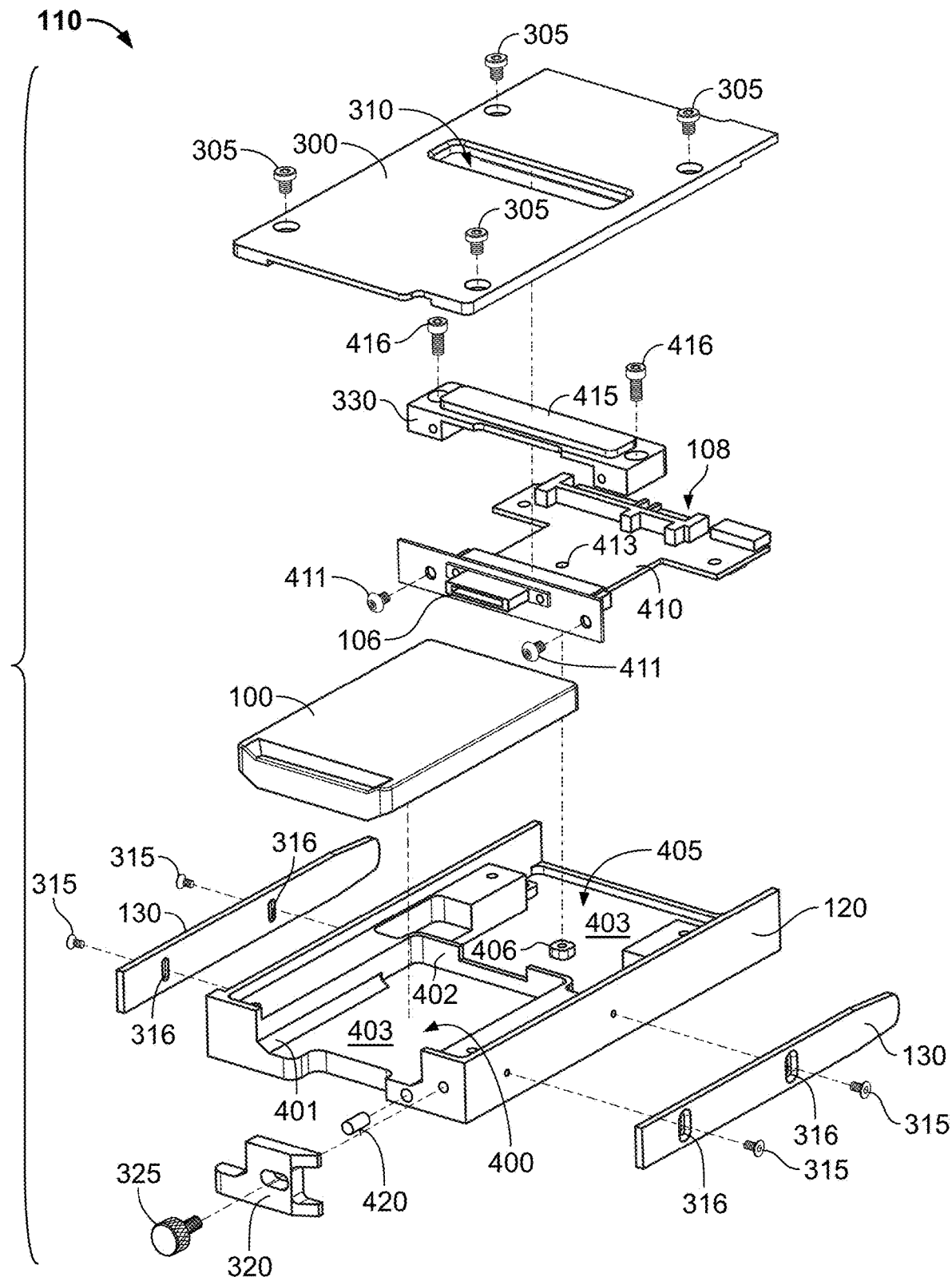
FIG. 4 shows an exploded view of the enclosure of FIG. 3.

FIG. 4 graphically illustrates an exploded view of the exemplary mechanical storage device enclosure having the exemplary storage device. As illustrated in FIG. 4, the mechanical storage device enclosure 350 can further include a storage device receptacle 400 that receives the storage device 100, an interface card receptacle 405 that receives the electrical interface card 112, a wall 402 disposed between storage device receptacle 400 and interface card receptacle 405, and a bottom wall 403 that defines a bottom of the receptacle and a bottom of the interface card receptacle. In some embodiments, the electrical interface card 112 can be secured to the mechanical housing 120 by inserting a fastener, such as a nut, screw, bolt, and/or lag to provide some examples, through a hole 413 in electrical interface card 112 and a hole 406 in the interface card receptacle 405.

In some embodiments, the storage device receptacle 400 can be shaped appropriately to receive the storage device 100. For example, a cross-section of the storage device 100 may have a rectangular shape or hexagonal shape. In some embodiments, a cross-section of the storage device 100 is a convex hexagon. The storage device receptacle 400 may have a shape corresponding to outer surfaces of the storage device 100. For example, the storage device receptacle 400 may include angled surfaces 401 that correspond to angled sides on the storage device 100. The shape of storage device receptacle 400 may ensure that the storage device 100 is properly positioned when inserted in storage device receptacle 400 as described above in FIG. 1B through FIG. 1D.

In some embodiments, the storage device receptacle 400 is defined at least in part by the mechanical housing 120. In some embodiments, the storage device receptacle 400 can be integral with the mechanical housing 120. In some embodiments, the storage device receptacle 400 can be removably coupled to the mechanical housing 120. If the storage device receptacle 400 is removably coupled to the mechanical housing 120, the storage device receptacle 400 can be interchangeable such that mechanical storage device enclosure 110 may accommodate storage devices 100 having a different size and/or shape.

The storage device receptacle 400 can be sized to receive various storage devices 100. In some embodiments, the storage device receptacle 400 is configured to couple to the storage device 100 that has a height of about 0.25 inches to about 0.5 inches, for example, about 0.3 inches or about 0.4 inches, and a width of about 1.5 inches to about 2 inches, for example, about 1.75 inches. In some embodiments, the storage device 100 has a height of about 0.25 inches to about 0.5 inches, for example, about 0.3 inches or about 0.4 inches, and a width of about 1.5 inches to about 2 inches, for example, about 1.75 inches. The storage device receptacle 400 may have a width of about 30% to about 90% of a width of the mechanical housing 120. In some embodiments, the storage device receptacle 400 may have a width of about 50% to about 75% of a width of the mechanical housing 120.

Figure 5:
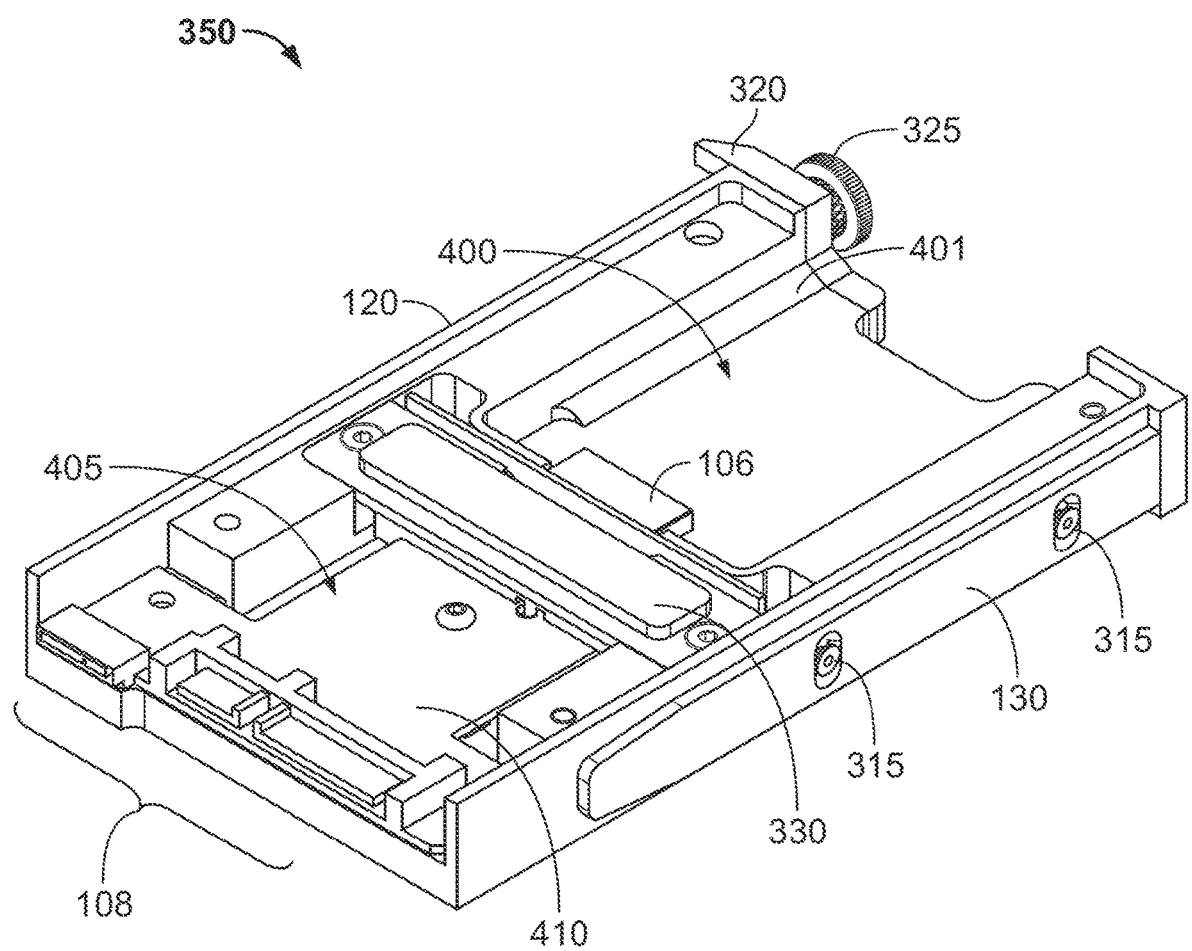
FIG. 5 shows a perspective view of the enclosure of FIG. 3 with the top enclosure removed.
Figure 6A:
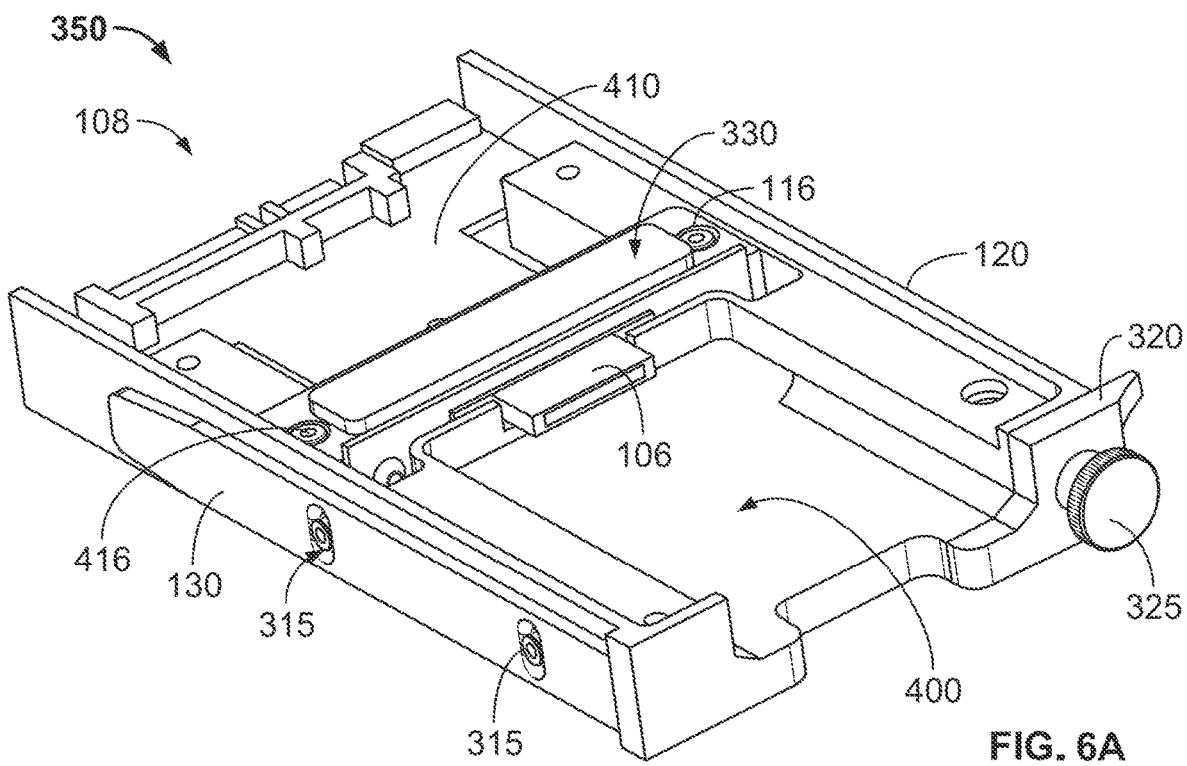
FIG. 6A shows a perspective view of the enclosure of FIG. 3 with the top enclosure removed.
Figure 6B:
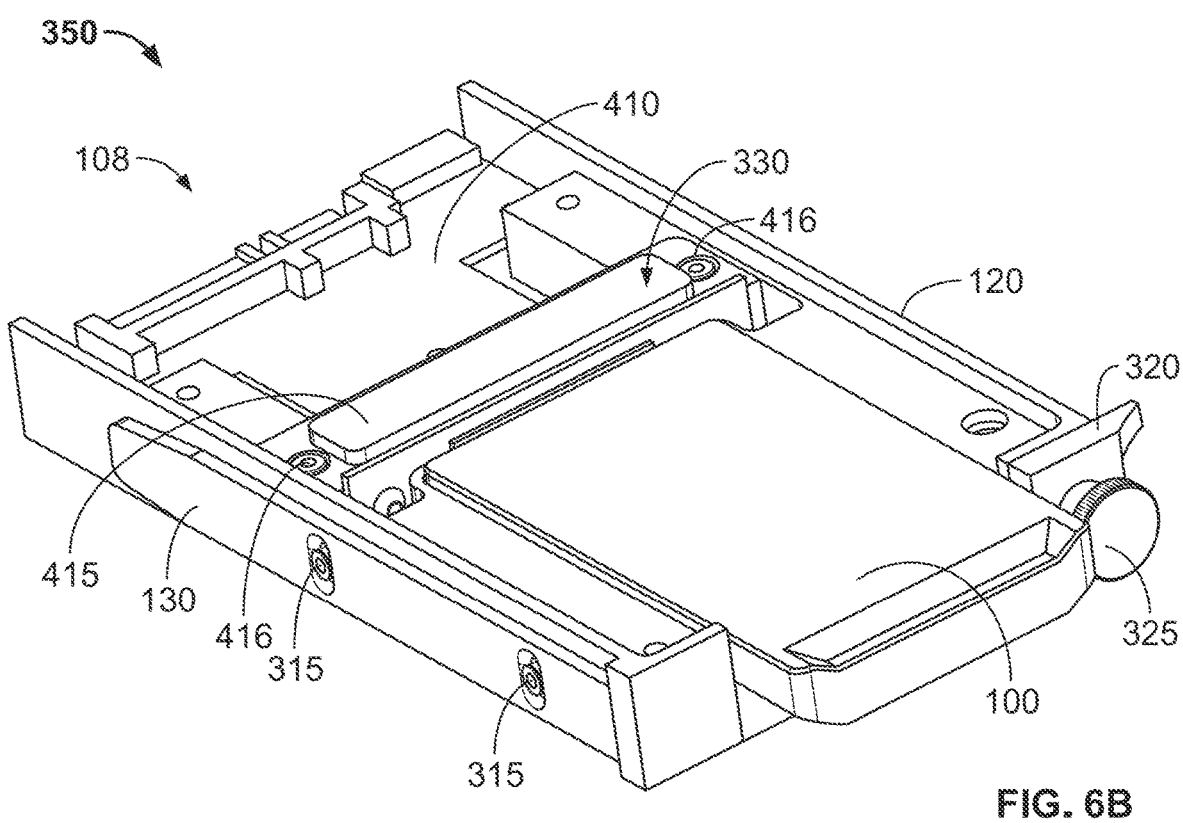
FIG. 6B shows a perspective view of the enclosure of FIG. 3 with the top enclosure removed and with a media coupled to the enclosure.

FIG. 5 through FIG. 6B further illustrate the exemplary mechanical storage device enclosure with and without the exemplary storage device. As illustrated in FIG. 5 through FIG. 6B, the mechanical storage device enclosure 350 may also include a cross piece or crossbar 330 that can secure the electrical interface card 112 to the mechanical housing 120 and provide strain relief to the electrical interface card 112 when the electrical interface card 112 is coupled to the storage device 100 as described above in FIG. 1B through FIG. 2C. The crossbar 330 may have a U-shaped structure that at least partially surrounds a portion of electrical interface card 112. When coupled to the mechanical housing 120, for example, by one or more fasteners 416, such as nuts, screws, bolts, and/or lags to provide some examples, crossbar 330 may secure electrical interface card 112 to the mechanical housing 120 and prevent electrical interface card 112 from moving. The electrical interface card 112 may also be coupled to crossbar 330 using one or more fasteners 411, such as nuts, screws, bolts, and/or lags to provide some examples. Accordingly, crossbar 330 may ensure that electrical interface card 112 is secure and properly aligned. The crossbar 330 may include an upward projection, for example, projection 415, which is configured to project through an opening in top enclosure 300, as discussed in more detail below.

Figure 7:
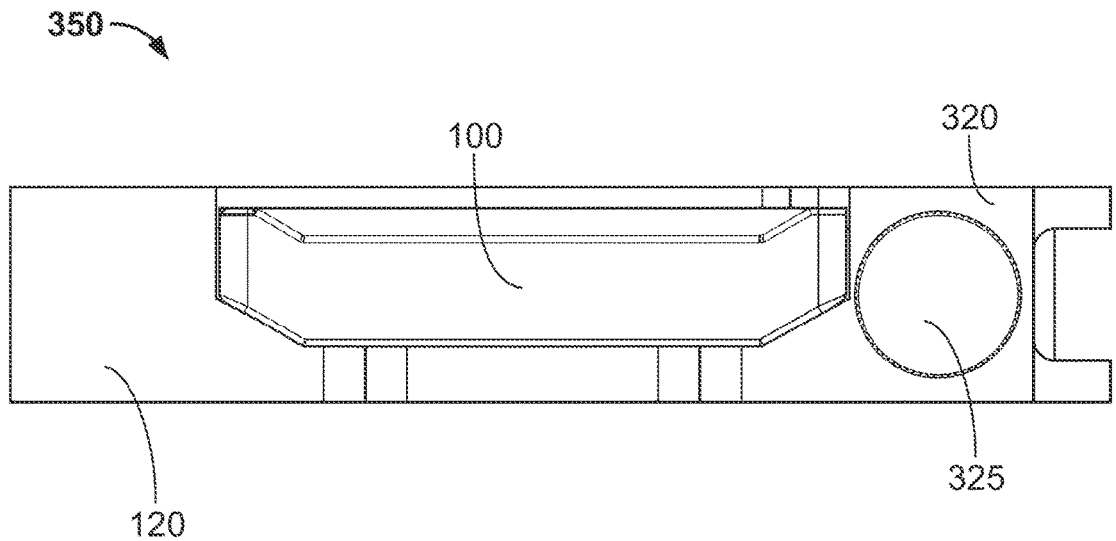
FIG. 7 shows a first side view of the enclosure of FIG. 3.
Figure 8:
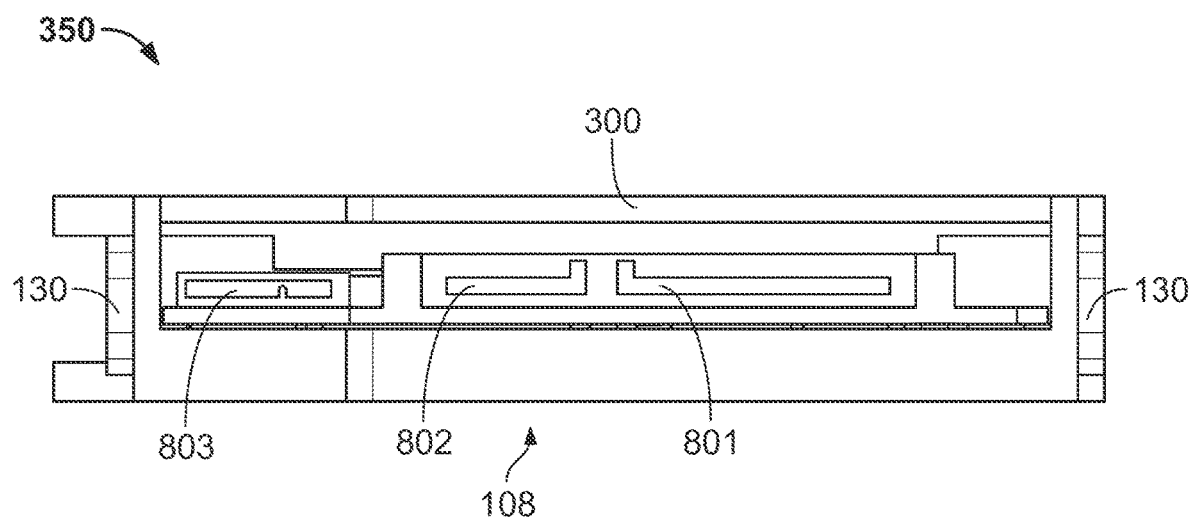
FIG. 8 shows a second side view opposite the first side view of the enclosure of FIG. 3.

FIG. 7 and FIG. 8 further illustrate front and back views of the exemplary mechanical storage device enclosure with and without the exemplary storage device. As illustrated in FIG. 7 and FIG. 8, the top enclosure 300 may couple to the mechanical housing 120. The top enclosure 300 may cover the storage device receptacle 400 and interface card receptacle 405 of the mechanical housing 120. The top enclosure 300 and the mechanical housing 120 may together define an opening in which the storage device 100 can be inserted as described above in FIG. 1B through FIG. 2C. In some embodiments, the opening defined by the mechanical housing 120 and the top enclosure 300 may have a height of about 0.05 inches to about 0.5 inches and a width of about 0.5 inches to about 2 inches. For example, the height can be about 0.05 inches, about 0.075 inches, about 0.1 inches, about 0.2 inches, about 0.3 inches, about 0.4 inches, or about 0.5 inches, or within a range having any two of these values as endpoints, inclusive of the endpoints. For example, the width can be about 0.5 inches, about 0.75 inches, about 1 inch, about 1.25 inches, about 1.5 inches, about 1.75 inches, or about 2 inches, or within a range having any two of these values as endpoints, inclusive of the endpoints. In some embodiments, the opening has a height of about 0.3 inches and a width of about 1.75 inches. Further, top enclosure 300 may include opening 310 that aligns with projection 415 of crossbar 330, as shown in FIG. 3 and FIG. 4. Alignment ensures a stable connection between the computer system connector 108 and a connector on computer system 200.

To ensure stable data transfer, all of the components should be securely coupled together. For example, the electrical interface card 112 can be electrically coupled to both computer system 200 and to the storage device 100 as described above in FIG. 1B through FIG. 2C. If computer system 200 does not securely receive mechanical storage device enclosure 110 or if mechanical storage device enclosure 110 does not securely receive the storage device 100, the connections may not be stable. This can cause failure or interruption of data transfer. In some embodiments, the mechanical storage device enclosure 110 can be designed to prevent such issues. For example, top enclosure 300 may made of a flexible material such that top enclosure 300 flexes when mechanical storage device enclosure 110 is inserted in a drive bay 205 of computer system 200. This allows for a secure fit without damaging mechanical storage device enclosure 350.

Additionally, the mechanical storage device enclosure 350 may include a locking system that can secure enclosure 350 within drive bay 205 of computer system 200. The locking system may include clip 320 and fastener 325, as illustrated in FIG. 7. This locking system ensures that mechanical storage device enclosure 350 is securely coupled within one of the drive bays 205 of computer system 200. For example, once mechanical storage device enclosure 350 has been inserted into drive bay 205, the clip 320 can be attached to the mechanical housing 120, then the fastener 325 can be used to secure the clip 320. This also secures the entire mechanical storage device enclosure 350 in drive bay 205, which in turn ensures a stable connection between computer system connector 108 of electrical interface card 112 and corresponding connectors of computer system 200. The locking system may also include alignment pin 420 that ensures clip 320 does not rotate when secured to the mechanical housing 120.

Figure 9:
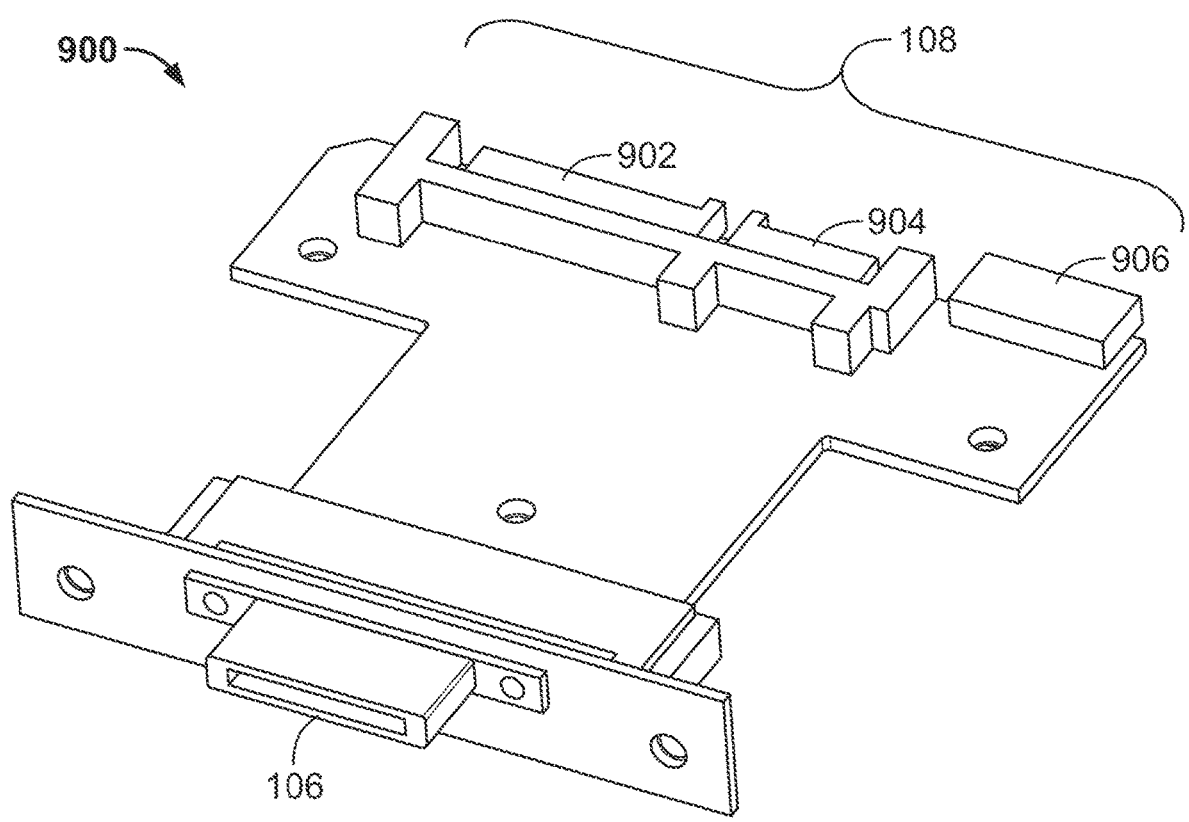
FIG. 9 shows an exemplary printed circuit board used in accordance with some exemplary embodiments.

Exemplary Electrical Interface Card Used with Some Exemplary Mechanical Storage Device Enclosures FIG. 9 illustrates an exemplary electrical interface card that can be used with the various exemplary mechanical storage device enclosures disclosed herein. As illustrated in FIG. 9, an electrical interface card 900 may include at least two connectors, such as storage device connector 106 and the computer system connector 108. The electrical interface card 900 as illustrated in FIG. 9 shares many substantially similar features as the electrical interface card 112 as described above in FIG. 1B through FIG. 1D; therefore, only differences between these mechanical storage device enclosures are to be described in further detail below. In some embodiments, the computer system connector 108 may include a first connector, for example, storage device connector 106, on a first side of a printed circuit board and a second connector, for example, computer system connector 108, on a second side of the printed circuit board. The first connector of electrical interface card 900 may couple with the storage device connector 104. The second connector may include multiple connectors 902 through 906, including power connectors and data connectors. In some embodiments, the connector 902 and the connector 904 are configured to transfer data. In some embodiments, the connector 906 is configured to couple to a USB cable. In some embodiments, the connector 904 is configured to couple to a connector (e.g., USB Micro B cable, 10 Gigabit Ethernet cable, 25 Gigabit Ethernet cable, fiber-optic cable, Thunderbolt cable, USB-C cable, or USB 3 cable). In some embodiments, the computer system connector 108 couples with a connector on computer system 200 to form a SATA interface. In some embodiments, the SATA interface is a SATA III interface. In some embodiments, computer system connector 108 couples with a connector on computer system 200 to form a PCI-e interface. In some embodiments, electrical interface card 900 provides an optical-to-electrical interface between the storage device 100 and computer system 200.

Exemplary Method of Assembling an Exemplary Mechanical Storage Device Enclosure

Figure 10:
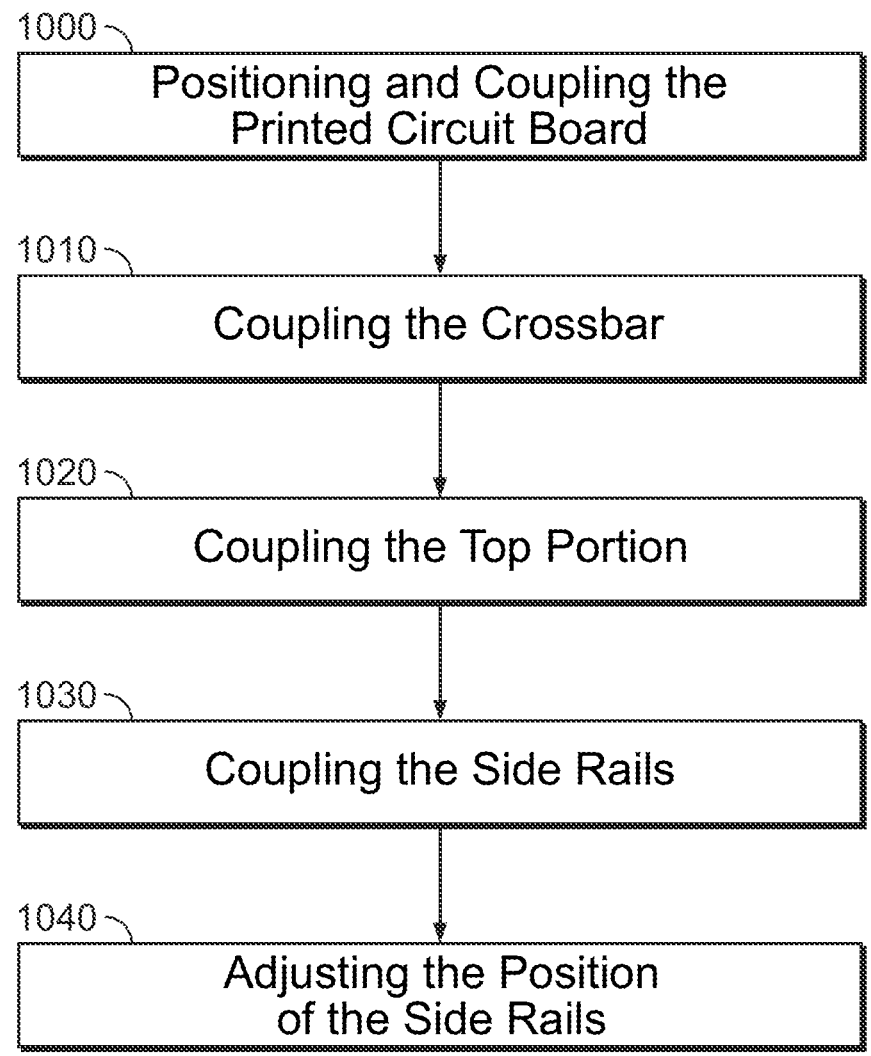
FIG. 10 shows a flow chart illustrating how an enclosure is assembled.

FIG. 10 illustrates an exemplary method for assembling an exemplary mechanical storage device enclosure. Mechanical storage device enclosure 110 can be assembled by first positioning and coupling electrical interface card 112 to the mechanical housing 120 at step 1000. After electrical interface card 112 has been positioned, crossbar 330 can be coupled to the mechanical housing 120 using one or more fasteners 416 at step 1010. This may secure electrical interface card 112 and prevent electrical interface card 112 from moving when mechanical storage device enclosure 110 is in use. Then top enclosure 300 can be coupled to mechanical housing 120 using fastener 305 at step 1020, which forms an opening in one end of mechanical storage device enclosure 110 that is sized to receive a media storage device, for example, the storage device 100. Guide rails can be coupled to opposite sides of the mechanical housing 120 by one or more fasteners 315 at step 1030. Guide rails may include opening 316. The position of guide rails can be adjusted at step 1040. For example, by at least partially screwing one or more fasteners 315, side rails can be adjusted up or down on the sides of the mechanical housing 120 to an appropriate position to properly align with corresponding tracks 206 in drive bays 205 of computer system 200. Once guide rails are in the appropriate position, mechanical storage device enclosure 110 can be inserted into drive bay 205 of computer system 200 such that guide rails engage with corresponding tracks 206 in drive bay 205. When assembled, mechanical storage device enclosure 110 can be removably inserted into a slot of a computer, for example, drive bay 205 of computer system 200 to electrically couple with a computer, as illustrated in FIGS. 2A-2C. In some embodiments, mechanical storage device enclosure 110 directly couples to computer system 200. As illustrated in FIG. 2B, multiple mechanical enclosures 110 can be used simultaneously in the various drive bays 205 of computer system 200.

Mechanical storage device enclosure 110 may then be pushed into drive bay 205 until electrical interface card 112 couples with a corresponding connector of computer system 200, as discussed in detail above. After electrical interface card 112 is coupled with a corresponding connector of computer system 200, clip 320, alignment pin 420, and fastener 325 can be used to secure mechanical storage device enclosure 110 to drive bay 205. Once mechanical storage device enclosure 110 has been secured to drive bay 205, the storage device 100 can be inserted into mechanical storage device enclosure 110 so as to electrically couple the storage device 100 to computer system 200 without any external cables.

Some embodiments are directed to an enclosure for coupling a storage device to a computer. The enclosure may comprise a mechanical housing 120; a receptacle defined by the mechanical housing 120, wherein the receptacle is configured to couple to the storage device; a printed circuit board coupled to the mechanical housing 120, the printed circuit board comprising a first connector and a second connector, wherein the first connector is configured to electrically couple to a third connector on the storage device, and wherein the second connector is configured to electrically couple to a fourth connector on the computer; and a first side rail and a second side rail, wherein the first and second side rails are removably coupled to the mechanical housing 120, wherein the first side rail and the second side rail are configured to removably engage with corresponding tracks in the computer.

In any of the various embodiments disclosed herein, the computer comprises at least one media slot configured to couple to the enclosure.

In any of the various embodiments disclosed herein, the enclosure has a width in a range of 2.5 inches to 3.5 inches.

In any of the various embodiments disclosed herein, the second connector and the fourth connector together form a SATA interface.

In any of the various embodiments disclosed herein, the second connector and the fourth connector together form a PCI-e interface.

In any of the various embodiments disclosed herein, the enclosure further comprises a crossbar coupled to the mechanical housing 120, wherein the crossbar is configured to align the enclosure in a media slot of the computer.

In any of the various embodiments disclosed herein, the enclosure further comprises a top enclosure removably coupled to the mechanical housing 120, wherein the top enclosure is made of a flexible material.

In any of the various embodiments disclosed herein, the enclosure further comprises a crossbar coupled to the mechanical housing 120, wherein the crossbar is configured to secure the printed circuit board.

In any of the various embodiments disclosed herein, the top enclosure comprises an opening, wherein the crossbar comprises a projection that aligns with the opening when the top enclosure is coupled to the mechanical housing 120.

In any of the various embodiments disclosed herein, the mechanical housing 120 has a width in a range of 2.5 inches to 3.5 inches and a height in a range of 0.5 inches to 1 inch.

In any of the various embodiments disclosed herein, the enclosure is configured to engage with the computer when the second connector is electrically coupled to the fourth connector.

In any of the various embodiments disclosed herein, the enclosure is configured to couple to the storage device while the enclosure is engaged with the computer.

In any of the various embodiments disclosed herein, the enclosure is configured to electrically couple the storage device to the computer without any external cables.

In any of the various embodiments disclosed herein, the first and second side rails each comprise a pair of elongated holes configured to adjust the position of the side rails.

In any of the various embodiments disclosed herein, the first side rail is replaceable with a third side rail and the second side rail is replaceable with a fourth side rail, wherein the first and second side rails each form a first shape, and wherein the third and fourth side rails each form a second shape that is different than the first shape.

In any of the various embodiments disclosed herein, the receptacle is defined by an outer surface of the mechanical housing 120.

In any of the various embodiments disclosed herein, the enclosure further comprises a top enclosure, wherein the top enclosure and the mechanical housing 120 together form the receptacle.

In any of the various embodiments disclosed herein, the enclosure is configured to directly couple with a computer chassis.

Some embodiments are directed to a system for coupling a storage device to a computer, the system comprising at least one enclosure, the enclosure comprising a mechanical housing 120, a receptacle defined in part by the mechanical housing 120, the receptacle configured to couple to the storage device, and a printed circuit board configured to couple to the storage device and to the computer. The computer may comprise a plurality of media slots, wherein each of the plurality of media slots is configured to couple to the enclosure. The enclosure can be configured to couple to the storage device when the enclosure is electrically coupled to the computer. The enclosure can be configured to electrically couple the storage device to the computer without external cables.

In any of the various embodiments disclosed herein, the receptacle is defined by the mechanical housing 120 and a top enclosure.

In any of the various embodiments disclosed herein, the plurality of media slots comprises 8 media slots, wherein the at least one enclosure comprises 8 enclosures, wherein each of the enclosures is coupled to one of the media slots.

In any of the various embodiments disclosed herein, each of the enclosures has a width in a range of 2.5 inches to 3.5 inches.

In any of the various embodiments disclosed herein, each media slot comprises a pair of tracks, and at least one enclosure comprises a pair of side rails configured to removably engage with the pair of tracks.

In any of the various embodiments disclosed herein, the pair of side rails are configured to be moved in a vertical direction so as to adjust the position of the enclosure within the media slot.

As used herein, the term "video camera" means any camera capable of recording high definition (1920×1080 pixels), 4K resolution, 8K resolution, 12K×6K resolution, 9K×7K resolution, or higher.

As used herein, the term "storage device" means any type of mass storage device designed for use in high-resolution cameras.

As used herein, the terms "upper" and "lower," and "top" and "bottom," "left" and "right," and the like are intended to assist in understanding of embodiments of the disclosure with reference to the accompanying drawings with respect to the orientation of embodiments shown, and are not intended to be limiting to the scope of the disclosure or to limit the disclosure scope to the embodiments depicted in the Figures. The directional terms are used for convenience of description and it is understood that embodiments shown can be positioned in any of various orientations.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The above examples are illustrative, but not limiting, of the present disclosure. Other suitable modifications and adaptations of the variety of conditions and parameters normally encountered in the field, and which would be apparent to those skilled in the art, are within the spirit and scope of the disclosure.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The breadth and scope of the present disclosure should not be limited by any of the above-described exemplary embodiments, but should be defined only in accordance with the following claims and their equivalents.

As used herein, when the term "about" is used in describing a value or an end-point of a range, the disclosure should be understood to include the specific value or end-point referred to. Whether or not a numerical value or end-point of a range recites "about," the numerical value or end-point is intended to include two embodiments: one modified by "about," and one not modified by "about." As used herein, the term "about" may include ±5%.

What is claimed is:

1. A system for coupling a storage device to a computer system, the system comprising:
    at least one enclosure, the enclosure comprising:
        a mechanical housing;
        a receptacle defined in part by the mechanical housing, the receptacle being configured to receive the storage device;
        an electrical interface card disposed in an interface card receptacle within the enclosure, wherein the electrical interface card is configured to couple to the storage device in the enclosure, and wherein the electrical interface card is configured to couple to the computer system; and
        a wall disposed between the receptacle and the interface card receptacle;
    wherein the computer system comprises a plurality of drive bays, wherein each of the plurality of drive bays is configured to couple to the enclosure;
    wherein the enclosure is configured to couple to the storage device when the enclosure is coupled to the computer system; and
    wherein the enclosure is configured to electrically couple the storage device to the computer system without external cables.

2. The system of claim 1, wherein the receptacle is defined by the mechanical housing and a top enclosure.

3. The system of claim 1, wherein the plurality of drive bays comprises 8 drive bays,
wherein the at least one enclosure comprises 8 enclosures, wherein each of the enclosures is coupled to one of the drive bays.

4. The system of claim 3, wherein each of the enclosures has a width in a range of 2.5 inches to 3.5 inches.

5. The system of claim 1, wherein each drive bay comprises a pair of tracks,
wherein the at least one enclosure comprises a pair of side rails configured to removably engage with the pair of tracks.

6. The system of claim 5, wherein the pair of side rails are configured to be moved in a vertical direction so as to adjust the position of the enclosure within the drive bay.

7. The system of claim 5, wherein the pair of side rails comprises a first side rail and a second side rail, and wherein the first side rail and the second side rail are replaceable.

8. The system of claim 7, wherein the first side rail has a first shape and the second side rail has a second shape, and
wherein the first side rail is configured to be replaced with a third side rail having a third shape that is different than the first shape and the second shape; and
wherein the second side rail is configured to be replaced with a fourth side rail having a fourth shape this is different than the first shape and the second shape.

9. The system of claim 1, wherein the at least one enclosure comprises a pair of side rails removably coupled to the mechanical housing.

10. The system of claim 9, wherein each drive bay comprises a pair of tracks, and wherein the pair of side rails are configured to removably engage with the pair of tracks.

11. The system of claim 9, wherein the side rails are movably coupled to the mechanical housing.

12. The system of claim 1, wherein the receptacle and the interface card receptacle are disposed horizontally next to each other.

13. The system of claim 1, wherein a bottom wall of the mechanical housing defines a bottom of the receptacle and a bottom of the interface card receptacle.

14. A computer system, the computer system comprising:
a plurality of drive bays, wherein each drive bay is configured to receive an enclosure, wherein the enclosure comprises:
a housing configured to receive a storage device;
an electrical interface card configured to couple to the storage device; and
a pair of side rails, wherein the side rails are movably coupled to the housing, and wherein each rail of the pair of side rails is movable in a first direction between a first position and a second position;
tracks disposed within each drive bay and extending in a second direction that is perpendicular to the first direction, wherein the tracks are configured to receive the pair of side rails; and
an electrical connector configured to couple to the electrical interface card.

15. The computer system of claim 14, wherein the side rails are removably coupled to the housing.

16. The computer system of claim 14, wherein the plurality of drive bays comprises 8 drive bays.

17. The computer system of claim 14, wherein each rail of the pair of rails is movable vertically.

18. The computer system of claim 14, wherein the pair of side rails are replaceable with a second pair of side rails.

19. A computer system for coupling to a storage device without external cables, the computer system comprising:
a drive bay configured to receive an enclosure that is configured to couple to the storage device, the drive bay including a first track on a first side of the drive bay, a second track on a second side of the drive bay that is opposite to the first side, and an opening configured to receive the enclosure, the enclosure including an electrical interface card having a computer system connector and a storage device connector configured to couple to a corresponding storage device connector of the storage device,
wherein the first track and the second track are configured to receive a corresponding first guide rail on a corresponding first side of the enclosure and a corresponding second guide rail on a corresponding second side of the enclosure, respectively,
wherein the first track and the second track are configured to direct the computer system connector of the enclosure to couple to a corresponding computer system connector within the drive bay when the enclosure is inserted through the opening, and
wherein the storage device is configured to be inserted into the enclosure once the enclosure has been secured to the drive bay to couple the storage device connector of the enclosure to the corresponding storage device connector of the storage device to couple the computer system to the storage device.

20. The computer system of claim 19, wherein a top side of the drive bay is configured to contact with a bulge on a corresponding top side of the enclosure when the enclosure is inserted through the opening to secure the enclosure within the drive bay.

21. The computer system of claim 19, wherein the corresponding first guide rail and the corresponding second guide rail of the enclosure are configured to be adjustable to align with the first track and the second track, respectively.

* * * * *